(12) United States Patent
Park et al.

(10) Patent No.: US 12,124,292 B2
(45) Date of Patent: Oct. 22, 2024

(54) DISPLAY APPARATUS

(71) Applicant: SAMSUNG ELECTRONICS CO., LTD., Suwon-si (KR)

(72) Inventors: Geumho Park, Suwon-si (KR); Boumsik Kim, Suwon-si (KR); Sunjin Kim, Suwon-si (KR); Woosung In, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/896,702

(22) Filed: Aug. 26, 2022

(65) Prior Publication Data

US 2024/0061465 A1  Feb. 22, 2024

Related U.S. Application Data

(63) Continuation of application No. PCT/KR2022/012451, filed on Aug. 19, 2022.

(30) Foreign Application Priority Data

Nov. 30, 2021  (KR) .................. 10-2021-0168579

(51) Int. Cl.
*G06F 1/16* (2006.01)
*G02F 1/1333* (2006.01)
(Continued)

(52) U.S. Cl.
CPC ...... *G06F 1/1607* (2013.01); *G02F 1/133314* (2021.01); *G06F 1/1601* (2013.01); *G06F 1/20* (2013.01); *H04N 5/64* (2013.01)

(58) Field of Classification Search
CPC ........ G06F 1/16; G06F 1/1601; G06F 1/1607; G06F 1/1637; G06F 1/1656;
(Continued)

(56) References Cited

U.S. PATENT DOCUMENTS 6,847,415 B1 * 1/2005 Yoshimura .......... G02F 1/13452
349/149
9,836,080 B2  12/2017 Park et al.
(Continued)

FOREIGN PATENT DOCUMENTS

KR  1999-0041725 U  12/1999
KR  1999-0041726 U  12/1999
(Continued)

OTHER PUBLICATIONS

Search Report (PCT/ISA/210) issued Dec. 19, 2022 by the International Searching Authority for International Patent Application No. PCT/KR2022/012451.
(Continued)

*Primary Examiner* — Adrian S Wilson
*Assistant Examiner* — Gage Crum
(74) *Attorney, Agent, or Firm* — Sughrue Mion, PLLC (57) ABSTRACT

A display apparatus includes a display panel, a rear chassis disposed at a rear of the display panel, a support plate disposed between the display panel and the rear chassis to dissipate heat generated by the display panel and to support the display panel, a plurality of printed circuit boards disposed at a rear of the rear chassis, and a cable provided to connect the plurality of printed circuit boards and disposed between the display panel and the support plate.

20 Claims, 11 Drawing Sheets

(51) Int. Cl.
*G06F 1/20* (2006.01)
*H04N 5/64* (2006.01)

(58) Field of Classification Search
CPC .......... G06F 1/1683; G06F 1/18; G06F 1/183;
G06F 1/184; G06F 1/185; G06F 1/20;
G06F 2200/1612; G02F 1/133308; G02F
1/13452; G02F 1/1333; G02F 1/133314;
G02F 1/133322; H05K 5/0247; H05K
5/0026; H05K 5/02; H05K 7/02; H05K
7/20; H10K 50/80; H10K 50/87
See application file for complete search history.

(56) References Cited

U.S. PATENT DOCUMENTS

| | | | | |
|---|---|---|---|---|
| 10,306,780 | B2* | 5/2019 | Heo | G02F 1/13452 |
| 10,349,534 | B2 | 7/2019 | Kim et al. | |
| 10,517,173 | B2 | 12/2019 | Kim | |
| 11,467,625 | B2* | 10/2022 | Ryu | G02F 1/133308 |
| 2017/0248815 | A1* | 8/2017 | Won | G02F 1/133308 |
| 2018/0027671 | A1* | 1/2018 | Kang | H05K 5/0213 |
| | | | | 361/707 |
| 2018/0263124 | A1* | 9/2018 | Gu | H05K 5/0026 |
| 2019/0029129 | A1* | 1/2019 | Kang | G02F 1/133308 |
| 2019/0327842 | A1* | 10/2019 | Ryu | G06F 1/1656 |
| 2020/0027391 | A1* | 1/2020 | Cho | H10K 59/12 |
| 2021/0165469 | A1* | 6/2021 | Kazama | G06F 1/183 |
| 2022/0066516 | A1* | 3/2022 | Cho | F16M 11/04 |
| 2022/0229327 | A1 | 7/2022 | Kang et al. | |
| 2022/0342255 | A1* | 10/2022 | Kang | G02F 1/1339 |

FOREIGN PATENT DOCUMENTS

| | | |
|---|---|---|
| KR | 10-0581869 B1 | 5/2006 |
| KR | 10-2008-0039049 A | 5/2008 |
| KR | 10-2016-0049272 A | 5/2016 |
| KR | 10-2016-0129832 A | 12/2016 |
| KR | 10-2017-0134152 A | 12/2017 |
| KR | 10-2018-0062269 A | 6/2018 |
| KR | 10-2021-0000108 A | 1/2021 |
| KR | 10-2021-0049578 A | 5/2021 |
| WO | WO-2021187711 A1 * | 9/2021 ....... G02F 1/133308 |

OTHER PUBLICATIONS

Written Opinion (PCT/ISA/237) issued Dec. 19, 2022 by the International Searching Authority for International Patent Application No. PCT/KR2022/012451.

* cited by examiner

DISPLAY APPARATUS

CROSS-REFERENCE TO RELATED APPLICATION(S)

This application is a bypass continuation of PCT International Application No. PCT/KR2022/012451 filed on Aug. 19, 2022, which is based on and claims priority under 35 U.S.C. § 119 to Korean Patent Application No. 10-2021-0168579 filed on Nov. 30, 2021, in the Korean Intellectual Property Office, the disclosures of which are incorporated by reference herein in their entirety.

BACKGROUND

1. Field

The disclosure relates to a display apparatus and more particularly to a display apparatus including an improved internal structure.

2. Related Art

Generally, a display apparatus is a kind of an output apparatus that converts obtained or stored electrical information into visual information and displays the visual information to a user and the display apparatus is used in various fields such as home or workplace.

The display apparatus may be classified into a self-luminous type including a display panel that emits light by itself such as an organic light emitting diode (OLED), and a non-self luminous type including a display panel that emits light by receiving light from a backlight unit without emitting light by itself, such as a liquid crystal panel (LCD).

As for a display apparatus including a display panel that emits light by itself, a thickness of the display apparatus is small because the display apparatus does not include a backlight unit. However, in the case of such a self-luminous display apparatus, it may not be easy to embed a cable inside the display apparatus or it may not be easy to arrange the cable without interfering with other components. Further, it may be difficult to disassemble and replace the display panel.

SUMMARY

In accordance with an aspect of the disclosure, a display apparatus includes a display panel, a rear chassis disposed at a rear of the display panel, a support plate disposed between the display panel and the rear chassis to dissipate heat generated by the display panel and to support the display panel, a plurality of printed circuit boards disposed at a rear of the rear chassis, and a cable provided to connect the plurality of printed circuit boards and disposed between the display panel and the support plate.

The support plate may include a support member in contact with the display panel to support the display panel, and a recess recessed from the support member, and the cable may be disposed between the display panel and the recess.

The recess may be recessed rearward from the support member.

The recess may extend in a left direction and a right direction.

The recess may include a receiving space, an extended surface extending rearwardly from the support member to form the receiving space, and a recessed surface connected to the extended surface and provided to have a step difference with the support member along a front direction and a rear direction, and the cable may be arranged in the receiving space of the recess.

The cable may be attached to the recessed surface.

The cable may be spaced apart from the recessed surface of the recess.

The cable may include an extension, and a plurality of connection members connected to the extension and provided to pass through a first through hole formed in the recess and to be connected to the plurality of circuit boards.

The rear chassis may further include a base formed to correspond to the support member of the support plate, and a chassis recess provided to correspond to the recess of the support plate and including an extended surface extending rearwardly from the base and a recessed surface connected to the extended surface, the recessed surface having a step difference with the base in the front direction and the rear direction.

The chassis recess may further include a second through hole formed in the chassis recess to correspond to the first through hole of the recess, and the plurality of connection member being provided to pass through the second through hole.

The display apparatus may further include a rear cover disposed at the rear of the rear chassis to cover the plurality of printed circuit boards and the chassis recess.

The rear cover may include a cover member provided to cover the plurality of printed circuit boards and to cover the chassis recess, the rear cover further including a coupling protrusion protruding forward from the cover member, the coupling protrusion being disposed between the cover member and the recessed surface of the recess in the front direction and the rear direction.

The coupling protrusion may be disposed between the recessed surface of the recess and the recessed surface of the chassis recess in the front direction and the rear direction.

The plurality of printed circuit boards may be fixed to a lower portion of the rear chassis.

The display panel may include a self-luminous panel including an organic light emitting diode (OLED).

The self-luminous panel may include a first surface facing in a front direction and a second surface facing in a rear direction opposite to the front direction. The display panel may further include a heat dissipation sheet adhered to the second surface of the self-luminous panel to dissipate heat generated from the self-luminous panel.

In accordance with an aspect of the disclosure, a display apparatus includes a display panel, a rear chassis disposed at a rear of the display panel, a support plate disposed between the display panel and the rear chassis to dissipate heat generated by the display panel and to support the display panel, the support plate comprising a groove, a plurality of printed circuit boards disposed at a rear of the rear chassis, and a cable comprising a first end and a second end, the cable being provided to connect the plurality of printed circuit boards at the first and the second ends, disposed between the display panel and the support plate, and disposed in the groove.

A portion of the cable disposed in the groove and in between the first and the second ends may be separated from the plurality of printed circuit boards by the support plate so as to protect the portion of the cable.

The cable may be attached to the support plate.
The cable may be spaced apart from the support plate.

BRIEF DESCRIPTION OF THE DRAWINGS

These and/or other aspects of the disclosure will become apparent and more readily appreciated from the following description of embodiments, taken in conjunction with the accompanying drawings.

DETAILED DESCRIPTION

Additional aspects of the disclosure will be set forth in part in the description which follows and, in part, will be obvious from the description, or may be learned by practice of the disclosure.

Embodiments described in the disclosure and configurations shown in the drawings are merely examples of the embodiments of the disclosure, and may be modified in various different ways at the time of filing of the present application to replace the embodiments and drawings of the disclosure.

In addition, the same reference numerals or signs shown in the drawings of the disclosure indicate elements or components performing substantially the same function.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

In the following detailed description, the terms of "front", "rear", "left", "right", and the like may be defined by the drawings, but the shape and the location of the component is not limited by the term.

The disclosure will be described more fully hereinafter with reference to the accompanying drawings.

Figure 1:
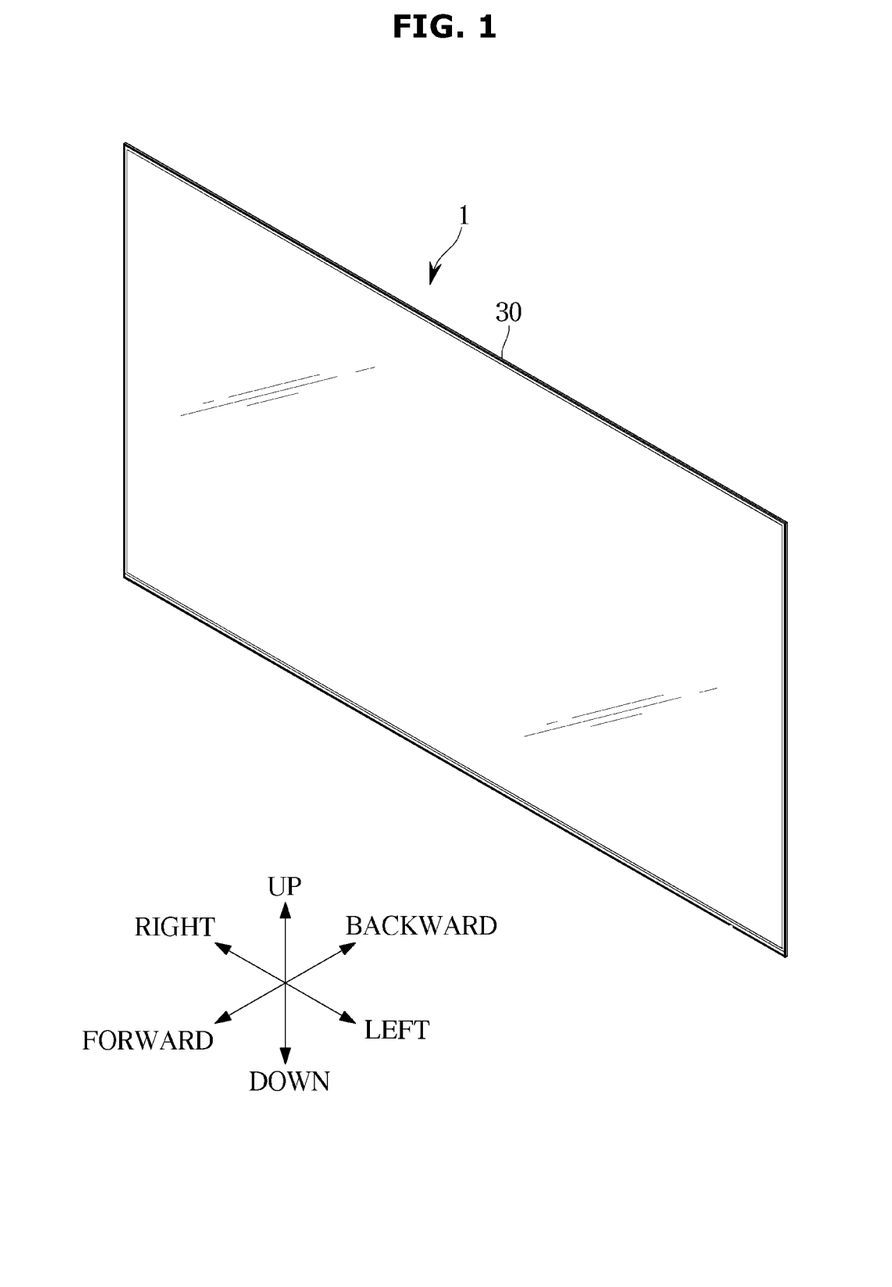
FIG. 1 is a front perspective view illustrating a display apparatus according to an embodiment of the disclosure.

FIG. 1 is a front perspective view illustrating a display apparatus according to an embodiment of the disclosure.

Referring to FIG. 1, a display apparatus 1 is a device that processes an image signal received from the outside and visually displays the processed image. Hereinafter, the display apparatus 1 is a television, but the disclosure is not limited thereto. For example, the display apparatus 1 may be implemented in various forms, such as a monitor, a portable multimedia device, and a portable communication device, and the display apparatus 1 is not limited in its shape as long as the display apparatus is configured to visually display an image.

The display apparatus 1 may be a large format display (LFD) installed outdoors, such as a roof of a building or a bus stop. The outdoor is not limited to the outside of a building, and thus the display apparatus 1 according to an embodiment may be installed in any places as long as the display apparatus is accessed by a large number of people, even indoors, such as subway stations, shopping malls, movie theaters, companies, and stores.

The display apparatus 1 may receive content data including a video signal and an audio signal from various content sources and output video and audio corresponding to the video signal and the audio signal. For example, the display apparatus 1 may receive content data through a broadcast reception antenna or cable, receive content data from a content playback device, or receive content data from a content providing server of a content provider. The display apparatus 1 may include a front chassis 30.

Figure 2:
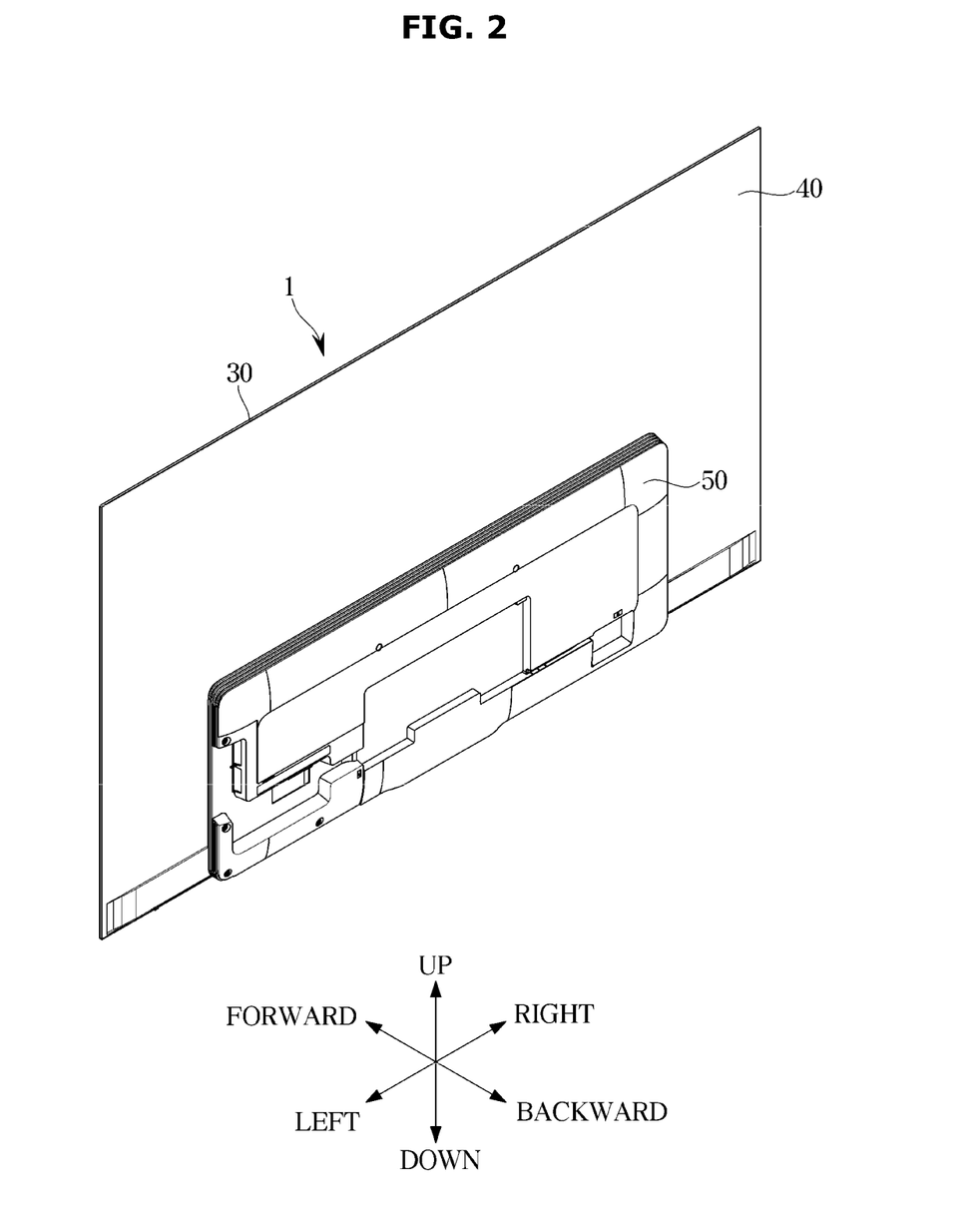
FIG. 2 is a rear perspective view illustrating the display apparatus according to an embodiment of the disclosure.

FIG. 2 is a rear perspective view illustrating the display apparatus according to an embodiment of the disclosure.

Referring to FIG. 2, the display apparatus 1 may include the front chassis 30, a rear chassis 40 and a rear cover 50. For example, a rear exterior of the display apparatus 1 may be formed by the rear chassis 40 and the rear cover 50.

The rear cover 50 may be coupled to the rear of the rear chassis 40. For example, the rear cover 50 may be coupled to the rear of the rear chassis 40, particularly, a lower center of the rear chassis 40. The rear cover 50 may be provided to cover a portion of the rear chassis 40. The rear cover 50 may protect a printed circuit board 70 arranged, e.g., disposed, on the rear side (refer to FIG. 4). A remaining portion of the rear chassis 40 not covered by the rear cover 50 may have a thickness less than that of the portion of the rear chassis 40 covered by the rear cover 50. According to an embodiment, a portion of the display apparatus 1 which has the greatest thickness may be a portion in which the rear cover 50 is arranged. As an area of the rear cover 50 increases, an area of the thick portion of the display apparatus 1 increases. Accordingly, as the area of the rear cover 50 is reduced, a user may feel that the overall of the display apparatus 1 is thinner. According to the present disclosure, it is possible to implement an ultra-slim appearance of the display apparatus 1 by minimizing the area of the rear cover 50.

Particularly, one end of the rear cover 50 and one end of the rear chassis 40 may be spaced apart by a predetermined distance. Similarly, the other end of the rear cover 50 and the other end of the rear chassis 40 may be spaced apart by the predetermined distance. In other words, the left end of the rear cover 50 and the left end of the rear chassis 40 may be spaced apart by a first distance, and the right end of the rear cover 50 and the right end of the rear chassis 40 may be spaced apart by the first distance. With the above structure, a peripheral portion on both lateral sides of the display apparatus 1 and a peripheral portion on an upper side of the display apparatus 1 may be relatively thin.

Figure 3:
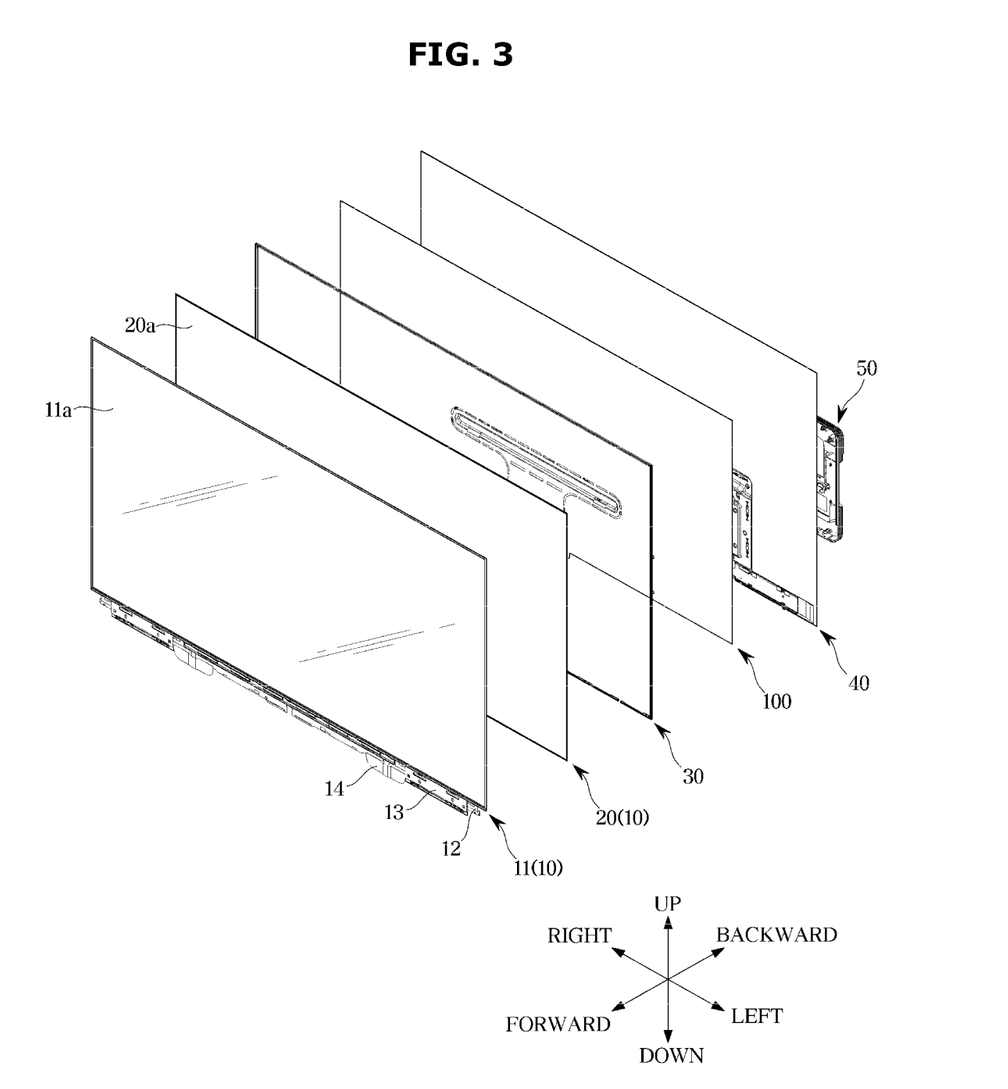
FIG. 3 is a front exploded perspective view illustrating the display apparatus according to an embodiment of the disclosure.
Figure 4:
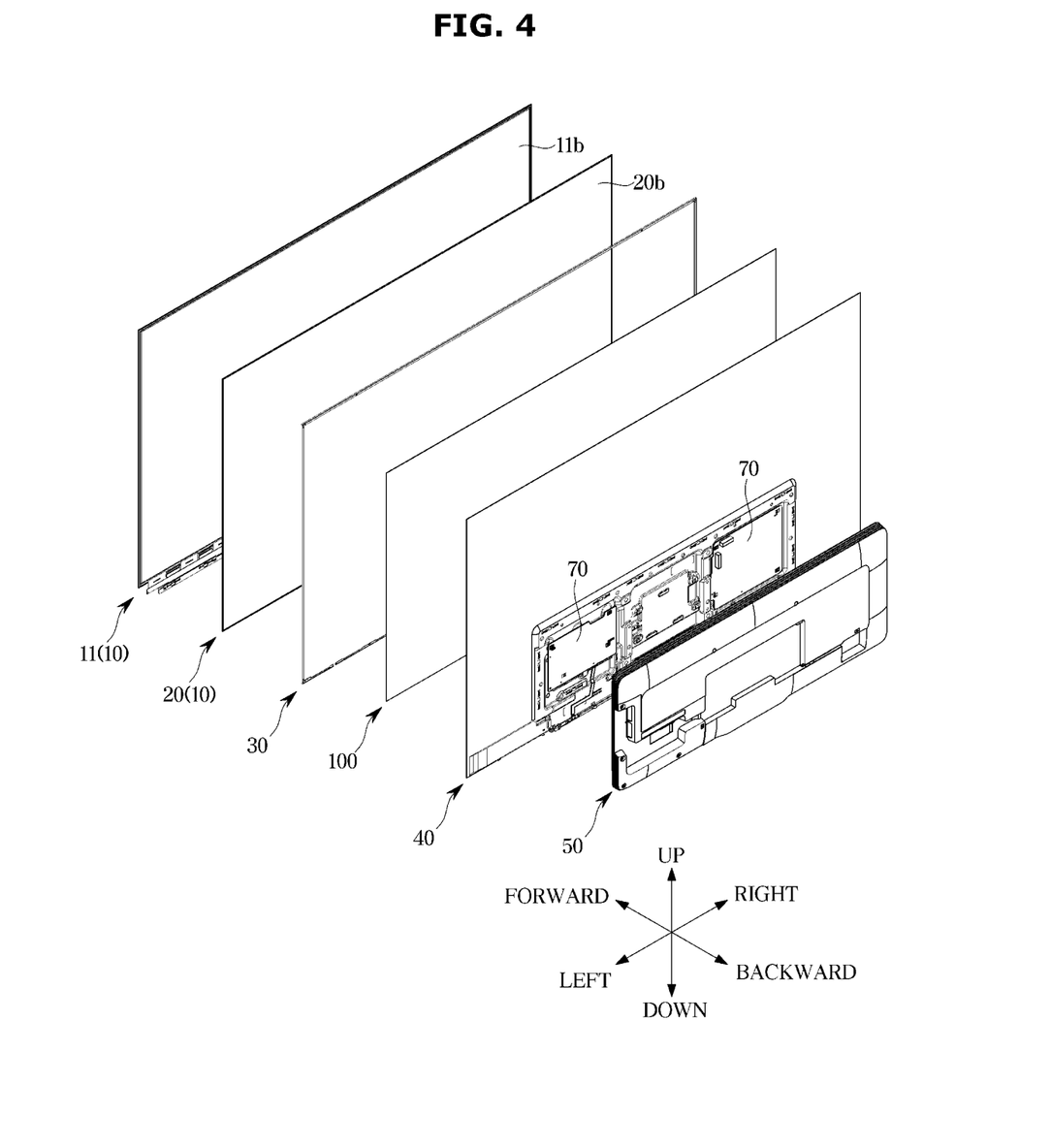
FIG. 4 is a rear exploded perspective view illustrating the display apparatus according to an embodiment of the disclosure.

FIG. 3 is a front exploded perspective view illustrating the display apparatus according to an embodiment of the disclosure. FIG. 4 is a rear exploded perspective view illustrating the display apparatus according to an embodiment of the disclosure.

Referring to FIGS. 3 and 4, the display apparatus 1 according to an embodiment may include a display panel 10, the front chassis 30 extending along a circumference of the display panel 10 to cover side surfaces of the display panel 10, the rear chassis 40 provided to cover the rear surface of the display panel 10, and the rear cover 50 provided to cover a portion of the rear surface of the rear chassis 40. In addition, the display apparatus 1 may further include an inner plate 100 provided between the display panel 10 and the rear chassis 40 and coupled to the front of the rear chassis 40 so as to increase a strength of the rear chassis 40 and to dissipate heat generated from the display panel 10.

The display panel 10 may be referred to as a display 10. The front chassis 30 may be referred to as an outer frame 30. The inner plate 100 may be arranged inside the outer frame 30. For example, the circumference of the inner plate 100 may be covered by the outer frame 30. The inner plate 100 may be referred to as a support plate 100 or a heat dissipation plate 100.

According to an embodiment, the display panel 10 may include a self-luminous panel 11 having a first surface 11a and a rear surface 11b and configured to emit light by itself and configured to display an image, and a heat dissipation sheet 20 provided to dissipate heat. The heat dissipation sheet 20 may be provided in a size corresponding to that of the self-luminous panel 11, and may be attached to the rear surface 11b of the self-luminous panel 11 by an adhesive member such as an adhesive or double-sided tape. The heat dissipation sheet 20 may have a front surface 20a and a rear surface 20b and be arranged behind the self-luminous panel 11. For example, the rear surface 11b of the self-luminous panel 11 may be adhered to the front surface 20a of the heat dissipation sheet 20. The front surface 20a of the heat dissipation sheet 20 may be a first surface 20a, and the rear surface 20b may be a second surface 20b.

The self-luminous panel 11 may be configured to display an image using an organic light emitting diode (OLED). The self-luminous panel 11 does not include a backlight unit and thus the self-luminous panel 11 may have a thickness less than that of the non-self luminous panel.

According to an embodiment, a film cable 12 may be provided at a lower end of the self-luminous panel 11. The film cable 12 may be in the form of a Chip On Film (COF) and coupled to the self-luminous panel 11. The film cable 12 may be formed of a flexible material to be bent. One end of the film cable 12 may be connected to the lower end of the self-luminous panel 11, and the other end of the film cable 12 may be bent to be arranged adjacent to the rear surface 20b of the heat dissipation sheet 20.

A substrate 13 may be arranged at the other end of the film cable 12. The substrate 13 may be configured to send a signal to drive the self-luminous panel 11. The substrate 13 may be coupled to the rear surface 20b of the heat dissipation sheet 20. The substrate 13 may be attached to the rear surface 20b of the heat dissipation sheet 20 by an adhesive member such as an adhesive or double-sided tape.

The number of substrates 13 may vary according to the size of the self-luminous panel 11. As a size of the self-luminous panel 11 increases, the number of substrates 13 may increase. The display apparatus 1 may include a connection cable 14 provided to connect two substrates 13 adjacent to each other. According to an embodiment, the display apparatus 1 may include four substrates 13, a cable 14 provided to connect two substrates of the four substrates 13, and a cable 14 provided to connect the remaining two substrates of the four substrates 13.

According to an embodiment, the heat dissipation sheet 20 may be attached to the rear surface 11b of the self-luminous panel 11 to dissipate heat. The heat dissipation sheet 20 may increase a contact area with the self-luminous panel 11 to effectively absorb heat from the self-luminous panel 11. To this, the heat dissipation sheet 20 and the self-luminous panel 11 may be coupled to each other by an adhesive member.

The heat dissipation sheet 20 may include at least one of graphite, aluminum, and copper. The heat dissipation sheet 20 may include graphite.

According to an embodiment, the heat dissipation sheet 20 may be provided to be detachable from the rear chassis 40. In other words, the heat dissipation sheet 20 may not be coupled to the rear chassis 40. Accordingly, the heat dissipation sheet 20 may be separated from the rear chassis 40 without any limitation.

The front chassis 30 may be provided to cover the side surface of the display panel 10. The front chassis 30 may be formed to extend along the circumference of the display panel 10. Accordingly, the front chassis 30 may be provided in a substantially square ring shape.

The rear chassis 40 may be provided to have a size corresponding to that of the display panel 10. The rear chassis 40 may be provided to cover the rear surface of the display panel 10. As described above, the rear chassis 40 together with the rear cover 50 may form the rear exterior of the display apparatus 1.

The inner plate 100 may have a size corresponding to that of the rear chassis 40 and may be coupled to the front surface of the rear chassis 40. The inner plate 100 may be coupled to the rear chassis 40 to increase the strength of the rear chassis 40. Accordingly, the inner plate 100 may be referred to as the support plate 100 or a reinforcement plate 100. Further, the inner plate 100 may be provided to dissipate heat generated from the display panel 10. Accordingly, the inner plate 100 may be referred to as the heat dissipation plate 100.

The rear cover 50 may be provided to cover a portion of the rear surface 40b of the rear chassis 40. The rear cover 50 may form an inner space by being coupled to the rear surface 40b of the rear chassis 40. In the inner space formed between the rear cover 50 and the rear chassis 40, a timing controller (T-con) board (not shown), a main board 71 configured to control the components of the display apparatus 1, and a power board 72 may be arranged. For example, the T-con board, the main board 71, and the power board 72 may be fixed to the rear chassis 40 from the rear and/or the rear surface 40b of the rear chassis 40 (refer to FIG. 8).

In the display apparatus 1 according to an embodiment, the self-luminous panel 11, the heat dissipation sheet 20, the inner plate 100, the rear chassis 40, and the rear cover 50 may be sequentially arranged in a front direction and a rear direction.

The display apparatus 1 according to an embodiment may include the printed circuit board 70. The printed circuit board 70 may be provided in plurality. The plurality of printed circuit boards 70 may include the T-con board (not shown), the main board 71, and the power board 72 to be described later (refer to FIG. 8). The main board 71 may correspond to a first board 71, the power board 72 may correspond to a second board 72, and the T-con board may correspond to a third board. For example, the first board 71, the second board 72, and the third board may be arranged to be spaced apart from each other.

The plurality of printed circuit boards 70 may be arranged between the rear chassis 40 and the rear cover 50. For example, the plurality of printed circuit boards 70 may be coupled to the rear chassis 40 at a rear lower portion of the rear chassis 40. The plurality of printed circuit boards 70 may be arranged under a recess 120 to be described later. In an exemplary embodiment, the recess 120 may be a groove, channel, raceway, or a slot. The printed circuit board 70 is arranged in the lower portion of the rear chassis 40, and thus it is possible to prevent an increase in a length of the cable connected to an external power source. Further, it is possible to minimize a portion in which the thickness of the display apparatus 1 is increased.

Figure 6:
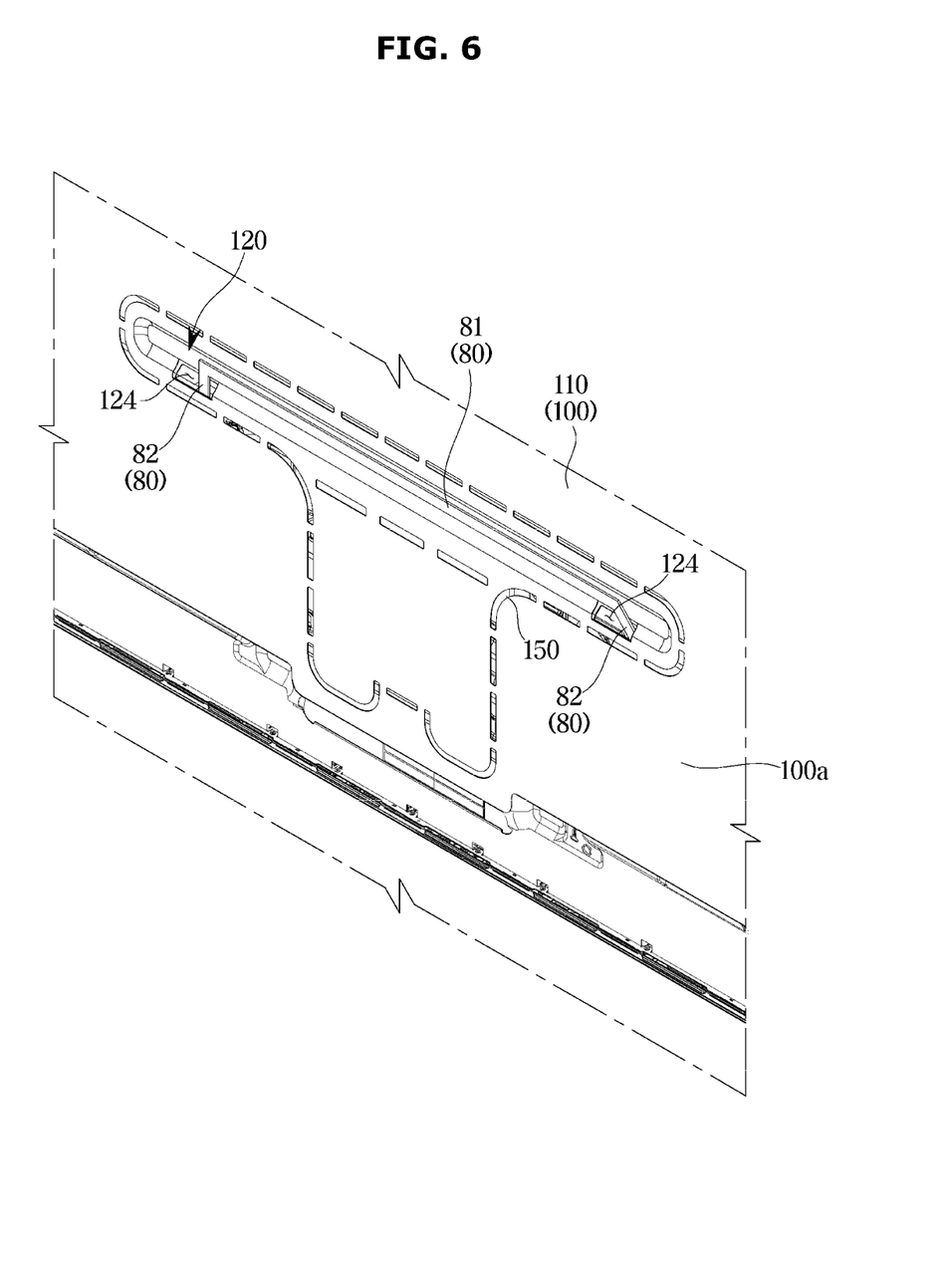
FIG. 6 is an enlarged view illustrating the display apparatus shown in FIG. 5.

The display apparatus 1 according to an embodiment may further include a cable 80 provided to connect the plurality of printed circuit boards 70 (refer to FIG. 6). For example, the cable 80 may electrically and/or physically connect the main board 71 and the power board 72. In addition, the cable 80 may be connected to an external power source and/or the connection cable 14.

Figure 5:
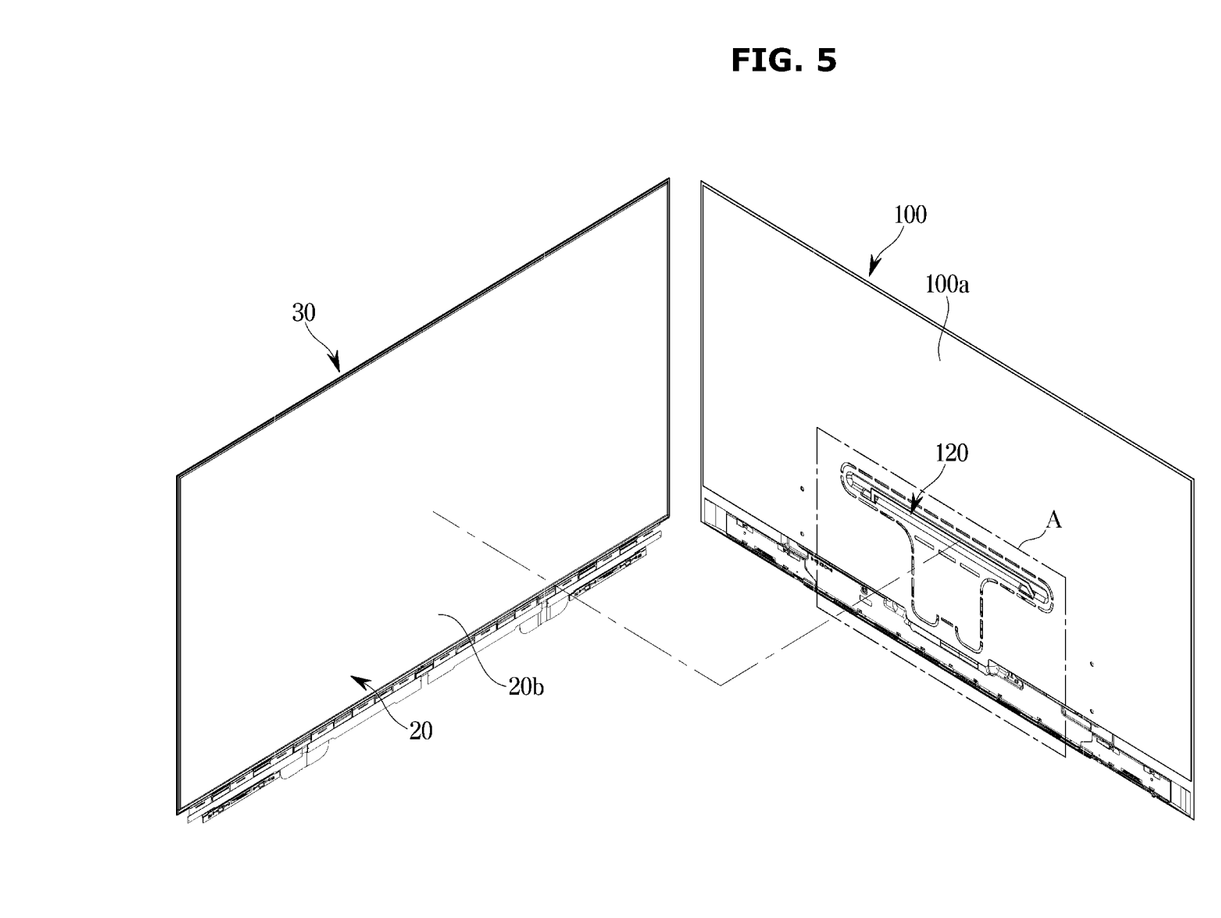
FIG. 5 is a perspective view illustrating a coupling relationship of some components in the display apparatus according to an embodiment of the disclosure.

FIG. 5 is a perspective view illustrating a coupling relationship of some components in the display apparatus according to an embodiment of the disclosure. FIG. 6 is an enlarged view illustrating the display apparatus shown in FIG. 5. Specifically, FIG. 6 is an enlarged view of a part A of FIG. 5, and illustrates the front side and/or a front surface 100*a* of the inner plate 100.

Referring to FIGS. 5 and 6, in the display apparatus 1 according to an embodiment, the inner plate 100 may be arranged behind the heat dissipation sheet 20. For example, the rear surface 20*b* of the heat dissipation sheet 20 may be in contact with the front surface 100*a* of the inner plate 100. Accordingly, the inner plate 100 may be in contact with the heat dissipation sheet 20 to receive heat from the heat dissipation sheet 20 and to support the heat dissipation sheet 20.

The inner plate 100 may include a support member 110 and the recess 120.

The support member 110 may be arranged at the rear of the display panel 10 to support the display panel 10. For example, the support member 110 may be in contact with the rear surface 20*b* of the heat dissipation sheet 20 to support the display panel 10. In addition, the support member 110 may be in contact with the heat dissipation sheet 20 to receive heat from the heat dissipation sheet 20 and dissipate heat to the outside. The support member 110 may be referred to as a heat dissipation member 110.

The recess 120 may be recessed from the support member 110. For example, the recess 120 may protrude rearward from the support member 110. The recess 120 may be recessed toward the rear chassis 40. When the inner plate 100 is viewed from the rear, a region, in which the recess 120 is formed, may protrude (refer to FIG. 7). The recess 120 may be referred to as an embossing portion.

The recess 120 may extend in one direction. For example, the recess 120 may extend in a left direction and a right direction. The cable 80 may include an extension 81 and a plurality of connection members 82 to be described later. The recess 120 may receive the cable 80. For example, the recess 120 may receive the extension 81 extending to connect the plurality of printed circuit boards 70, and/or the plurality of connection members 82 of the cable 80. The recess 120 may be referred to as a receiving member 120.

A through hole 124 may be formed in the recess 120. The through hole 124 may be provided in plurality. The cable 80 may pass through the through holes 124. For example, the connection member 82 may pass through the through holes 124 and then be connected to the circuit boards 70 coupled to the rear surface 40*b* of the rear chassis 40. The through hole 124 formed in the recess 120 may correspond to a first through hole which may be formed in an extended surface 122 and a recessed surface 123 of the support member 110 to be described later.

Further, holes 150 may be formed around the recess 120. However, a shape of each of the holes 150 is not limited to that shown in the above example or drawings.

Figure 8:
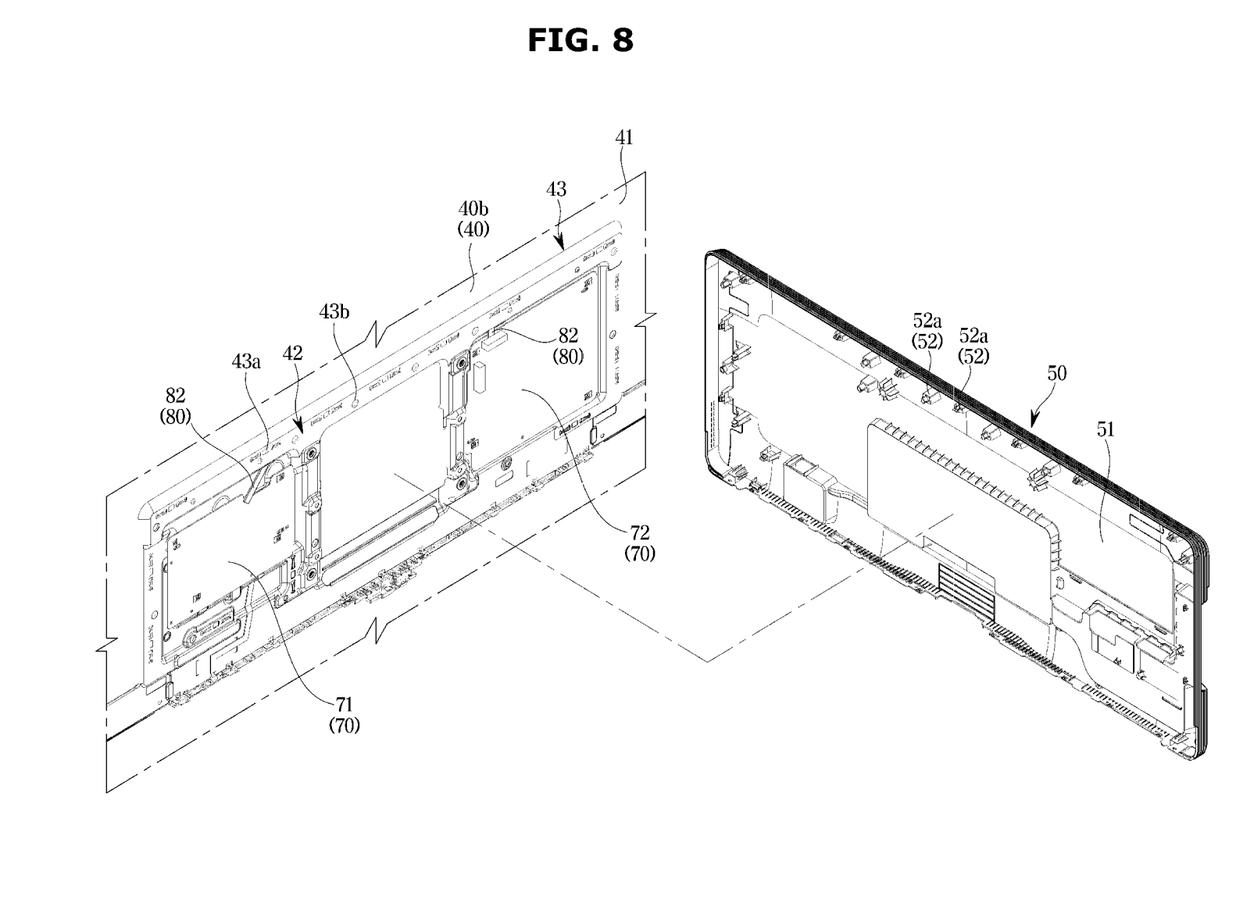
FIG. 8 is an enlarged-perspective view illustrating a coupling relationship of some components in the display apparatus according to an embodiment of the disclosure.

As mentioned above, the extension 81 of the cable 80 may be provided in the recess 120, and only the connection member 82 may be connected to the printed circuit board 70 through the through hole 124. Accordingly, because a receiving space 121 for the cable 80 is provided in the display apparatus according to an embodiment, the coupling of the rear cover 50 coupled at the rear of the rear chassis 40 may be free. For example, as shown in FIG. 8, because the cable 80 is minimally arranged between the rear chassis 40 and the rear cover 50, a restriction in a space in which coupling protrusions 52 are provided may be minimized. In addition, components for use of the display apparatus may be arranged between the rear cover 50 and the rear chassis 40 without the restriction in space.

In addition, because the receiving space 121 for the cable 80 is separated from a coupling space 42*d* of the rear chassis 40 and the rear cover 50 by the recess 120, it is possible to prevent a damage of the cable 80.

Figure 7:
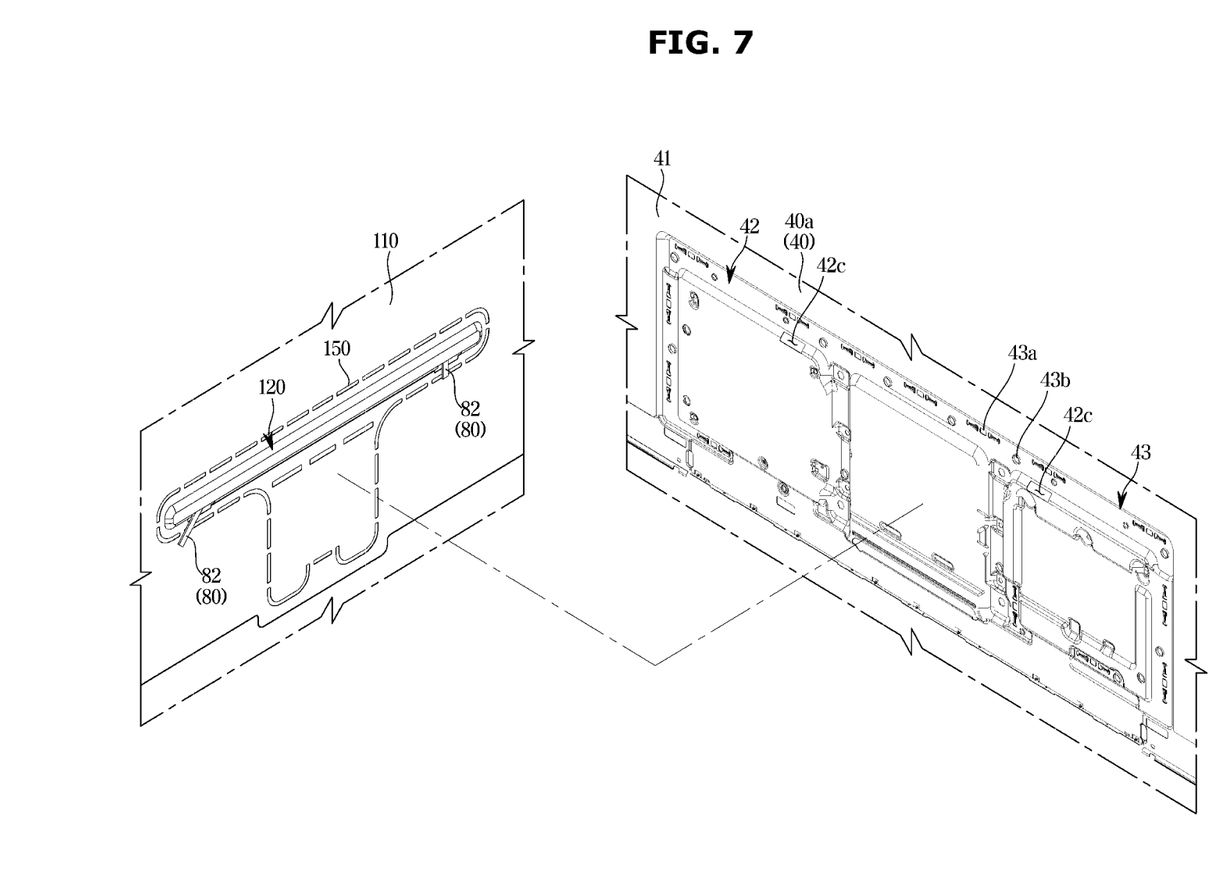
FIG. 7 is an enlarged-perspective view illustrating a coupling relationship of some components in the display apparatus according to an embodiment of the disclosure.

FIG. 7 is an enlarged-perspective view illustrating a coupling relationship of some components in the display apparatus according to an embodiment of the disclosure. Specifically, FIG. 7 is a perspective view illustrating the rear surface of the inner plate 100 and the front surface of the rear chassis 40.

Referring to FIG. 7, the display apparatus according to an embodiment may include the inner plate 100 and the rear chassis 40. The inner plate 100 and the rear chassis 40 may be coupled to each other. For example, the rear chassis 40 may be arranged at the rear of the inner plate 100 to support the inner plate 100.

The recess 120 may protrude rearward from the support member 110. The recess 120 may face the rear chassis 40. When the inner plate 100 is viewed from the rear, a region, in which the recess 120 is formed, may protrude.

The rear chassis 40 may include a base 41 and a chassis recess 42 corresponding to the recess 120 of the inner plate 100. The chassis recess 42 may be recessed from the base 41. For example, the chassis recess 42 may protrude rearward from the base 41. The chassis recess 42 may be recessed toward the rear cover 50. When the rear chassis 40 is viewed from the rear, a region, in which the chassis recess 42 is formed, may protrude (refer to FIG. 8). The chassis recess 42 may be referred to as a chassis embossing portion 42.

A second through hole 42c, through which the connection member 82 passes, may be formed in the chassis recess 42. The second through holes 42c may be provided in plurality. The cable 80 may pass through the second through hole 42c. For example, the connection member 82 may pass through the second through hole 42c and be connected to the circuit board 70 coupled to the rear surface of the rear chassis 40. The second through hole 42c may be formed on an extended surface 42a and a recessed surface 42b of the chassis recess 42 (refer to FIG. 10).

The rear chassis 40 may include a coupler 43 provided to allow the rear chassis 40 and the rear cover 50 to be coupled to each other. The coupler 43 may be formed at a lower portion of the rear chassis 40. The coupler 43 may include coupling holes 43a and 43b. The coupling holes 43a and 43b may be formed around the coupler 43. The coupling holes 43a and 43b may include a first coupling hole 43a and a second coupling hole 43b. The first coupling hole 43a may correspond to a hook 52b to be described later, and the second coupling hole 43b may correspond to a boss 52a to be described later. The first coupling hole 43a and the second coupling hole 43b may be alternately formed. However, the disclosure is not limited thereto, and positions of the first coupling hole 43a and the second coupling hole 43b are not limited thereto.

FIG. 8 is an enlarged-perspective view illustrating a coupling relationship of some components in the display apparatus according to an embodiment of the disclosure. Specifically, FIG. 8 is a perspective view illustrating the rear surface of the rear chassis 40 and the front surface of the rear cover 50.

Referring to FIG. 8, the display apparatus according to an embodiment may include the rear chassis 40 and the rear cover 50. The rear chassis 40 and the rear cover 50 may be coupled through the coupler 43. The rear cover 50 may cover a rear portion of the rear chassis 40. For example, the rear cover 50 may cover the printed circuit board 70 and the coupler 43.

The printed circuit board 70 may be arranged at the rear of the rear chassis 40. The printed circuit board 70 may be coupled to the rear surface 40b of the rear chassis 40. For example, the printed circuit board 70 may be coupled to the rear chassis 40 through the coupler 43 provided in the lower portion of the rear surface 40b.

The rear cover 50 may include a cover member 51 and a coupling protrusion 52. The cover member 51 may cover the rear of the rear chassis 40. The cover member 51 may cover the printed circuit board 70 and the coupler 43.

The coupling protrusion 52 may protrude from the cover member 51 toward the rear chassis 40. For example, the coupling protrusion 52 may protrude forward from the cover member 51. The coupling protrusion 52 may include the boss 52a and the hook 52b. The boss 52a and the hook 52b may be alternately formed. However, the disclosure is not limited thereto, and the positions of the boss 52a and the hook 52b are not limited thereto. The hook 52b may be coupled to the first coupling hole 43a, and the boss 52a may be coupled to the second coupling hole 43b.

As for the cable 80, only the connection member 82 provided to connect the printed circuit board 70 is arranged between the rear chassis 40 and the rear cover 50, and other part of the cable 80 is not arranged between the rear chassis 40 and the rear cover 50. Accordingly, a space, in which the coupling holes 43a and 43b and the coupling protrusion 52 are provided, may be free. Accordingly, a space utilization inside the display apparatus may be increased.

Figure 9:
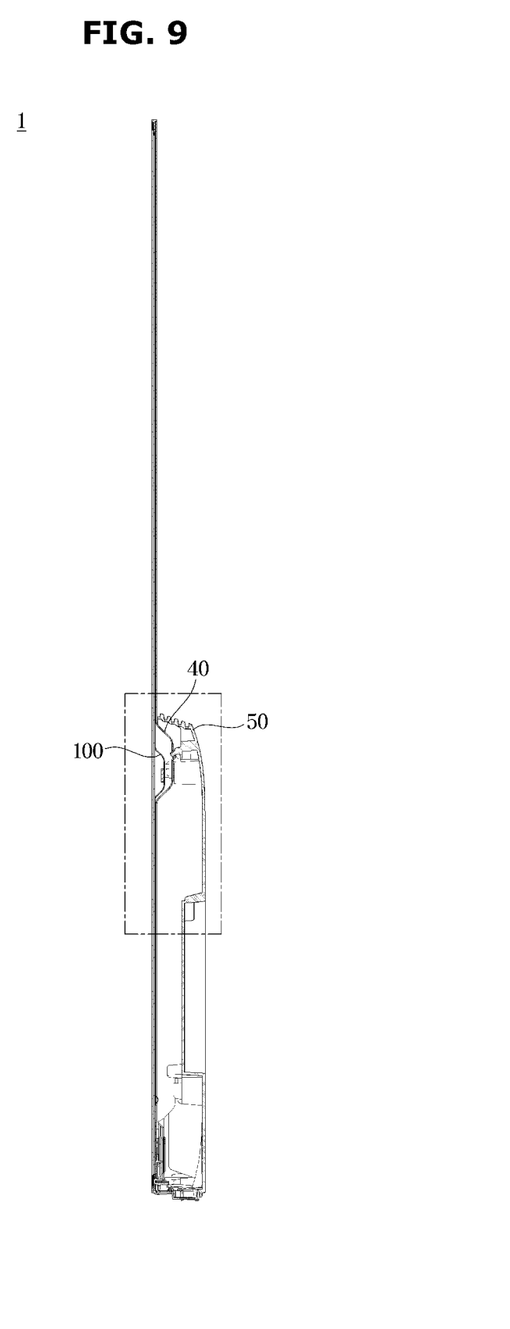
FIG. 9 is a cross-sectional view illustrating the display apparatus according to an embodiment of the disclosure.
Figure 10:
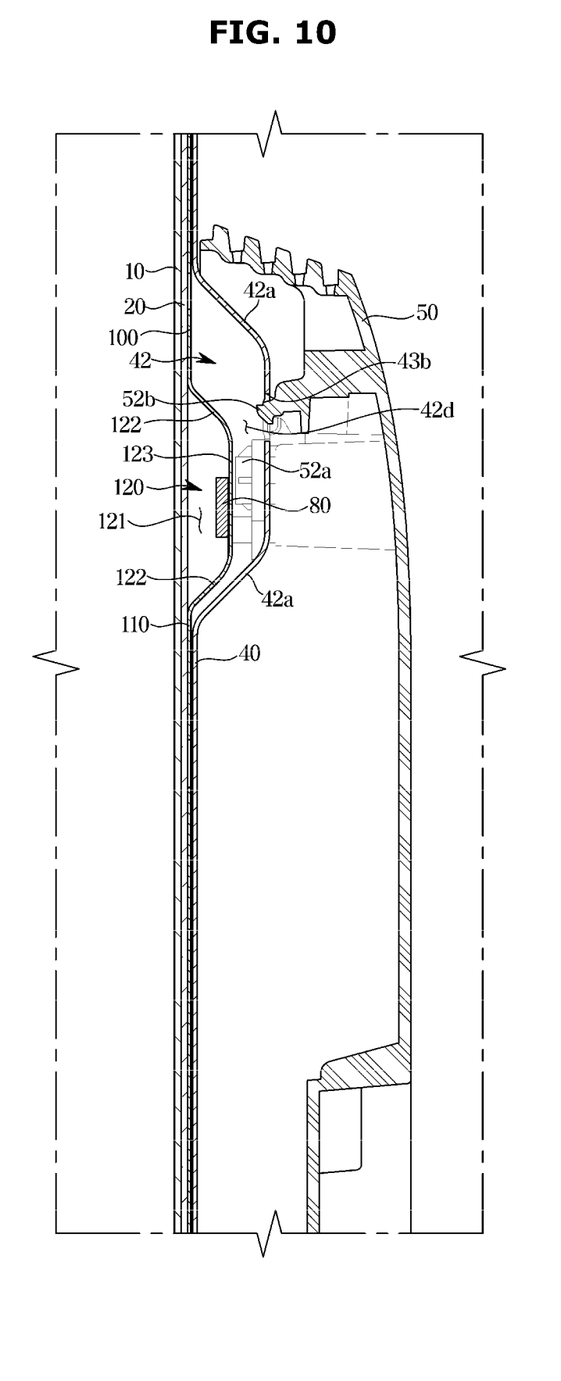
FIG. 10 is an enlarged cross-sectional view illustrating the display apparatus shown in FIG. 9.

FIG. 9 is a cross-sectional view illustrating the display apparatus according to an embodiment of the disclosure. FIG. 10 is an enlarged cross-sectional view illustrating the display apparatus shown in FIG. 9.

Referring to FIGS. 9 and 10, the display apparatus 1 according to an embodiment may include the display panel 10 including the self-luminous panel 11 and the heat dissipation sheet 20, the inner plate 100, the rear chassis 40 and the rear cover 50.

At the rear of the heat dissipation sheet 20, the inner plate 100 may be in contact with the heat dissipation sheet 20. For example, the support member 110 of the inner plate 100 may be in contact with the heat dissipation sheet 20.

The inner plate 100 may include the recess 120 recessed rearward from the support member 110. The recess 120 may include the receiving space 121, the extended surface 122, and the recessed surface 123.

The receiving space 121 may be formed in a region in which the recess 120 is recessed rearward. The receiving space 121 may be a space between the display panel 10 and the inner plate 100. The cable 80 may be arranged in the receiving space 121.

The extended surface 122 may extend rearwardly from the support member 110 to form the receiving space 121. The extended surface 122 may be inclined. The extended surface 122 may be provided in plurality. The recessed surface 123 may be arranged between the plurality of extended surfaces 122. The recessed surface 123 may have a step difference with the support member 110 in the front direction and the rear direction. The receiving space 121 may be formed between the recessed surface 123 and the support member 110.

The cable 80 may be arranged in the receiving space 121. For example, the cable 80 may be attached to the recessed surface 123. The cable 80 may be attached to the recessed surface 123 through a double-sided tape or an adhesive member. However, the position and/or attachment method of the cable 80 is not limited thereto, and the cable 80 may be attached to the extended surface 122 or not attached to the extended surface 122 or the recessed surface 123. Because the cable 80 is arranged within the recess 120 of the inner plate 100, the cable 80 may be protected and prevented from being damaged from other components of the display apparatus.

The rear chassis 40 may include the base 41 and the chassis recess 42. The chassis recess 42 may be formed to correspond to the recess 120 of the inner plate 100. The chassis recess 42 may be recessed rearward from the base 41. The chassis recess 42 may include the coupling space 42d, the extended surface 42a, and the recessed surface 42b.

The coupling space 42d may be formed in a region in which the chassis recess 42 is recessed rearward. The coupling space 42d may be a space between the rear chassis 40 and the inner plate 100. The coupling protrusion 52 may be received in the coupling space 42d. For example, a portion of the boss 52a and/or the hook 52b may be received in the coupling space 42d.

The extended surface 42a may extend rearwardly from the base 41 to form the coupling space 42d. The extended surface 42a may be inclined. The extended surface 42a may be provided in plurality. The recessed surface 42b may be arranged between the plurality of extended surfaces 42a. The recessed surface 42b may have a step difference with the base 41 in the front direction and the rear direction. The coupling space 42d may be formed between the recessed surface 42b and the base 41. The coupling protrusion 52 may penetrate the recessed surface 42b.

In the display apparatus according to an embodiment, the receiving space 121 of the cable 80 may be provided separately from the coupling space 42d of the rear chassis 40 and the rear cover 50. Accordingly, because the occurrence of interference between the cable 80 and the coupling protrusion 52 is minimized, a position, in which the coupling protrusion 52 and coupling holes 43a and 43b for coupling the rear chassis 40 and the rear cover 50 are formed, may be free. Further, additional components necessary for use of the display apparatus may be arranged between the rear chassis 40 and the rear cover 50.

Figure 11:
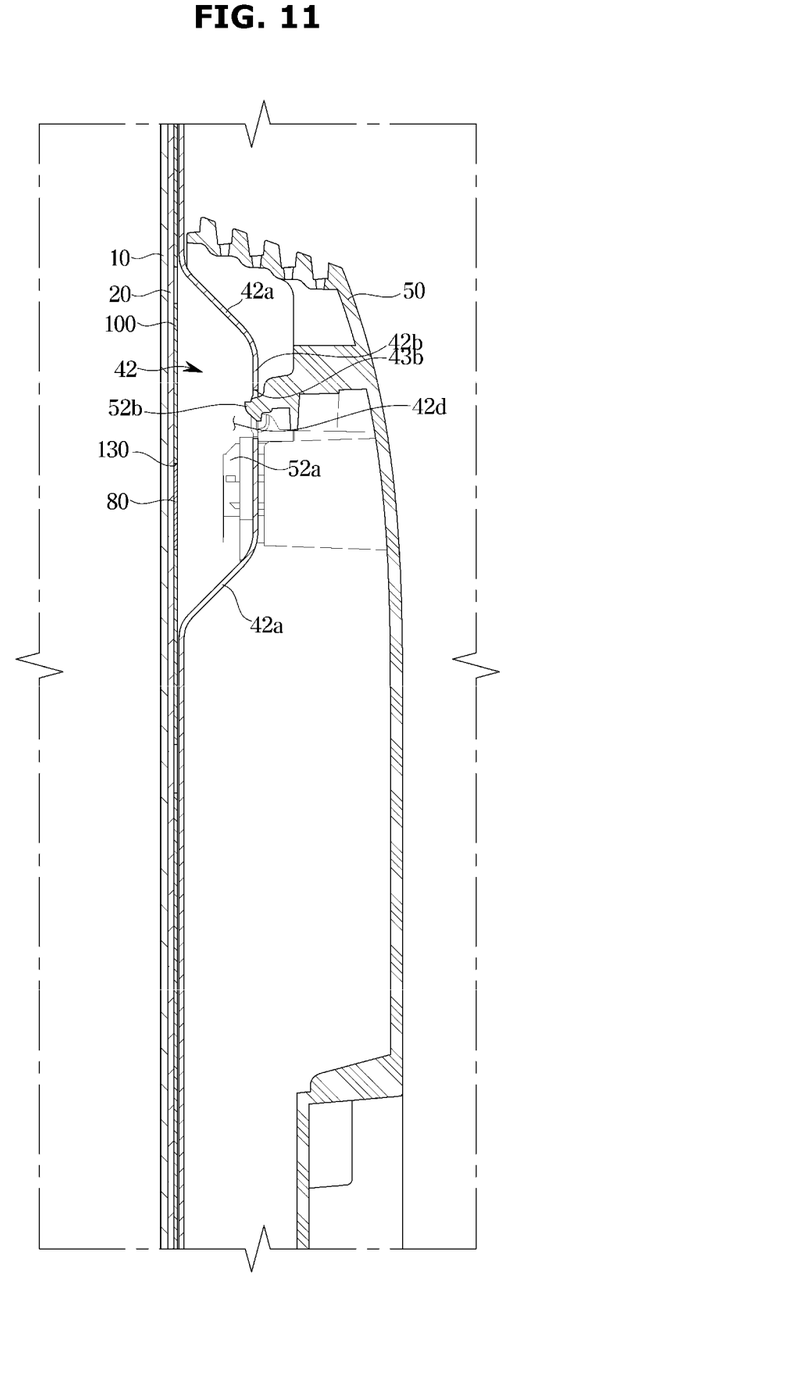
FIG. 11 is an enlarged cross-sectional view illustrating the display apparatus according to an embodiment of the disclosure.

FIG. 11 is an enlarged cross-sectional view illustrating the display apparatus according to an embodiment of the disclosure.

Referring to FIG. 11, the display apparatus according to an embodiment of the present disclosure may include the inner plate 100. The inner plate 100 may include a receiving hole 130 penetrating the support member 110.

The cable 80 may be arranged in the receiving hole 130. At least a portion of the cable 80 may be arranged in the receiving hole 130. For example, the cable 80 may be arranged in the receiving hole 130 and may be attached to the inner plate 100 and/or the display panel 10 through an adhesive member or the like. The cable 80 may be attached to the rear surface 20b of the display panel.

The receiving hole 130 may extend in one direction. For example, the receiving hole 130 may extend in the left direction and the right direction.

The rear chassis 40 may include the chassis recess 42. The chassis recess 42 may be recessed rearward from the base 41. The chassis recess 42 may include the coupling space 42d, the extended surface 42a, and the recessed surface 42b.

The coupling space 42d may be formed in a region in which the chassis recess 42 is recessed rearward. A portion of the boss 52a and/or the hook 52b may be received in the coupling space 42d.

The display apparatus according to an embodiment may separate the position, in which the rear chassis 40 and the rear cover 50 are coupled to each other, from the space in which the cable 80 is received. Accordingly, because the occurrence of interference between the cable 80 and the coupling protrusion 52 is minimized, a position, in which the coupling protrusion 52 and coupling holes 43a and 43b for coupling the rear chassis 40 and the rear cover 50 are formed, may be free. Further, additional components necessary for use of the display apparatus may be arranged between the rear chassis 40 and the rear cover 50.

As is apparent from the above description, by providing a space in which a cable is arranged, a display apparatus may prevent a damage of the cable.

By providing a space in which a cable is arranged, a display apparatus may allow a position of a coupling member between a rear chassis and a rear cover, to be free.

According to an embodiment, the display apparatus includes a receiving space for the cable separated from a coupling space of the rear chassis and the rear cover by the recess and thus the cable may be protected and prevented from being damaged from other components of the display apparatus.

Although a few embodiments of the disclosure have been shown and described, it would be appreciated by those skilled in the art that changes may be made in these embodiments without departing from the principles and spirit of the disclosure, the scope of which is defined in the claims and their equivalents.

What is claimed is:

1. A display apparatus comprising:
   a display panel having a front surface and a rear surface and extending in a vertical direction and a horizontal direction perpendicular to the vertical direction;
   a rear chassis disposed at a rear of the display panel;
   a support plate disposed between the display panel and the rear chassis to dissipate heat generated by the display panel and to support the display panel, wherein the support plate comprises a support member and a recess which is recessed rearward from the support member;
   a plurality of printed circuit boards disposed at a rear of the rear chassis; and
   a cable provided to connect the plurality of printed circuit boards and disposed between the display panel and the support plate,
   wherein the recess comprises a receiving space and a surface recessed rearward from the support plate to form the receiving space,
   wherein the cable is disposed between the display panel and the recessed surface in the receiving space of the recess,
   wherein the support member comprises an upper portion extending from an upper end of the support plate to the recess in the vertical direction and a lower portion extending from the recess to a lower end of the support plate in the vertical direction,
   wherein a front surface of the upper portion of the support member is in parallel to and in contact with the rear surface of the display panel, and a front surface of the lower portion of the support member is in parallel to and in contact with the rear surface of the display panel,
   wherein the rear chassis comprises a base formed to correspond to the support member of the support plate and a chassis recess recessed rearward from the base to form a space between the support plate and the rear chassis and provided to correspond to the recess of the support plate,
   wherein the base of the rear chassis comprises an upper portion extending from an upper end of the rear chassis to the chassis recess in the vertical direction, and a lower portion extending from the chassis recess to a lower end of the rear chassis, and
   wherein a front surface of the upper portion of the base is in parallel to and in contact with a rear surface of the upper portion of the supporting member, and a front surface of the lower portion of the base is in parallel to and in contact with a rear surface of the lower portion of the supporting member.

2. The display apparatus of claim 1, wherein the recess is recessed rearward from the support member.

3. The display apparatus of claim 1, wherein the recess extends in the horizontal direction.

4. The display apparatus of claim 2, wherein the recess further comprises an extended surface extending rearwardly from the support member to form the receiving space, and the recessed surface is connected to the extended surface and is provided to have a step difference with the support member along a front direction and a rear direction, each of the front direction and the rear direction being perpendicular to each the vertical direction and the horizontal direction.

5. The display apparatus of claim 4, wherein the cable is attached to the recessed surface.

6. The display apparatus of claim 4, wherein the cable is spaced apart from the recessed surface.

7. The display apparatus of claim 4, wherein the cable comprises an extension, and a plurality of connection members connected to the extension and provided to pass through a first through hole formed in the recess and to be connected to the plurality of printed circuit boards.

8. The display apparatus of claim 7, wherein the chassis recess comprises an extended surface extending rearwardly from the base and a recessed surface connected to the extended surface of the chassis recess, the recessed surface of the chassis recess having a step difference with the base in the front direction and the rear direction.

9. The display apparatus of claim 8, wherein the chassis recess further comprises a second through hole formed in the chassis recess to correspond to the first through hole of the recess, and the plurality of connection members being provided to pass through the second through hole.

10. The display apparatus of claim 8, further comprising:
a rear cover disposed at the rear of the rear chassis to cover the plurality of printed circuit boards and the chassis recess.

11. The display apparatus of claim 10, wherein the rear cover comprises a cover member provided to cover the plurality of printed circuit boards and to cover the chassis recess, the rear cover further comprising a coupling protrusion protruding forward from the cover member, the coupling protrusion being disposed between the cover member and the recessed surface of the recess in the front direction and the rear direction.

12. The display apparatus of claim 11, wherein the coupling protrusion is disposed between the recessed surface of the recess and the recessed surface of the chassis recess in the front direction and the rear direction.

13. The display apparatus of claim 1, wherein the plurality of printed circuit boards are fixed to the lower portion of the base of the rear chassis.

14. The display apparatus of claim 1, wherein the display panel comprises a self-luminous panel comprising an organic light emitting diode (OLED).

15. The display apparatus of claim 14, wherein the self-luminous panel comprises a first surface facing in a front direction, and a second surface facing in a rear direction opposite to the front direction, and
wherein the display panel further comprises a heat dissipation sheet adhered to the second surface of the self-luminous panel to dissipate heat generated from the self-luminous panel.

16. A display apparatus comprising:
a display panel having a front surface and a rear surface and extending in a vertical direction and a horizontal direction perpendicular to the vertical direction;
a rear chassis disposed at a rear of the display panel;
a support plate disposed between the display panel and the rear chassis to dissipate heat generated by the display panel and to support the display panel, wherein the support plate comprises a support member and a groove which is recessed rearward from the support member;
a plurality of printed circuit boards disposed at a rear of the rear chassis; and
a cable comprising a first end and a second end, the cable being provided to connect the plurality of printed circuit boards at the first end and the second end, disposed between the display panel and the support plate, and disposed in the groove of the support plate,
wherein the groove comprises a receiving space and a surface recessed rearward from the support plate to form the receiving space,
wherein the cable is disposed between the display panel and the recessed surface in the receiving space of the groove,
wherein the support member comprises an upper portion extending from an upper end of the support plate to the groove in the vertical direction and a lower portion extending from the groove to a lower end of the support plate in the vertical direction,
wherein a front surface of the upper portion of the support member is in parallel to and in contact with the rear surface of the display panel, and a front surface of the lower portion of the support member is in parallel to and in contact with the rear surface of the display panel,
wherein the rear chassis comprises a base formed to correspond to the support member of the support plate and a chassis recess recessed rearward from the base to form a space between the support plate and the rear chassis and provided to correspond to the groove of the support plate,
wherein the base of the rear chassis comprises an upper portion extending from an upper end of the rear chassis to the chassis recess in the vertical direction, and a lower portion extending from the chassis recess to a lower end of the rear chassis, and
wherein a front surface of the upper portion of the base is in parallel to and in contact with a rear surface of the upper portion of the supporting member, and a front surface of the lower portion of the base is in parallel to and in contact with a rear surface of the lower portion of the supporting member.

17. The display apparatus of claim 16, wherein a portion of the cable disposed in the groove and in between the first end and the second end is separated from the plurality of printed circuit boards by the support plate so as to protect the portion of the cable.

18. The display apparatus of claim 16, wherein the cable is attached to the support plate.

19. The display apparatus of claim 16, wherein the cable is spaced apart from the support plate.

20. The display apparatus of claim 16, wherein the chassis recess comprises an extended surface extending rearward from the base and a recessed surface connected to the extended surface of the chassis recess, the recessed surface of the chassis recess having a step difference with the base in a front direction and a rear direction.

* * * * *